(12) United States Patent
Chen

(10) Patent No.: US 7,514,821 B2
(45) Date of Patent: Apr. 7, 2009

(54) POWER SUPPLY SWITCHING CONTROLLER AND METHOD

(75) Inventor: Dong Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 175 days.

(21) Appl. No.: 11/323,266

(22) Filed: Dec. 30, 2005

(65) Prior Publication Data

US 2007/0052300 A1 Mar. 8, 2007

(30) Foreign Application Priority Data

Sep. 5, 2005 (TW) .............................. 94130318 A

(51) Int. Cl.
| | |
|---|---|
| H01H 9/54 | (2006.01) |
| H01H 47/00 | (2006.01) |
| G01M 19/00 | (2006.01) |
| G01R 35/00 | (2006.01) |
| G01R 31/00 | (2006.01) |

(52) U.S. Cl. ...................... 307/140; 702/108; 702/118; 702/120; 702/122; 702/188

(58) Field of Classification Search ................. 307/140
See application file for complete search history.

(56) References Cited

U.S. PATENT DOCUMENTS

| | | | | |
|---|---|---|---|---|
| 5,646,535 | A * | 7/1997 | Dornier ....................... 324/556 |
| 5,812,386 | A * | 9/1998 | Youn ........................... 363/86 |
| 6,248,602 | B1 * | 6/2001 | Bode et al. .................... 438/14 |
| 6,904,373 | B2 * | 6/2005 | Le et al. ....................... 702/60 |
| 6,930,730 | B2 * | 8/2005 | Maxon et al. ............... 348/734 |
| 7,114,017 | B2 * | 9/2006 | Parrish ........................ 710/62 |
| 7,180,209 | B2 * | 2/2007 | Hyde et al. ................. 307/143 |

\* cited by examiner

*Primary Examiner*—Stephen W Jackson
*Assistant Examiner*—Hal I Kaplan

(57) ABSTRACT

A power supply switching controller for controlling on-off switching of an electronic device includes a microprocessor connected to a power supply, a communication unit connecting the microprocessor to the electronic device for communication between them, and a relay connected between the microprocessor and the electronic device. A power supply switching control method is also provided.

15 Claims, 5 Drawing Sheets

POWER SUPPLY SWITCHING CONTROLLER AND METHOD

BACKGROUND OF THE INVENTION

1. Field of the Invention

The present invention relates to controllers and methods for controlling on-off switching of a power supply, more particularly to a controller and method for controlling on-off switching of a power supply for an electronic device.

2. General Background

Normally, a computer after being manufactured needs to be tested for its system stability. The testing process includes several different stages for running different testing programs. In the process, the computer needs to be started up or shut down frequently, and generally, this process is totally manually controlled by an operator throughout. Recently, a controller, that can control the computer to start up or shut down automatically, has been provided for this demand. The controller includes a setting unit to output a periodic testing signal, a triggering unit, and a control unit. The triggering unit outputs a trigger signal, when the power supply of the computer is to be switched on or switched off. The control unit acts as a timer, and outputs a control signal to turn on or turn off the power supply of the computer when a predetermined timing period elapses. However, the predetermined timing period from turning on until turning off the computer can only be set from 1 to 15 seconds, and it is manually set and stored in the setting unit. It is inconvenient for the operator to reset the timing period.

Accordingly, what is needed is a power supply switching controller and method which can set the timing period from starting up until shutting down the computer automatically.

SUMMARY

A power supply switching controller for controlling an electronic device to power-on or power-off includes a microprocessor connected to a power supply, a communication unit connecting the microprocessor to the electronic device for communication between the two, and a relay connected between the microprocessor and the electronic device and controlled by the microprocessor.

A power supply switching control method includes a plurality of steps as follows: providing a microprocessor connected to a power supply; providing a communication unit connecting the microprocessor to the electronic device for communication between the two; and providing a relay connected between the microprocessor and the electronic device and controlled by the microprocessor; wherein the microprocessor controls the relay to be on or off according to a plurality of running parameters already set in the microprocessor or already set in the electronic devicethereby controlling the electronic device to be powered-on or powered-off.

Other objects, advantages and novel features of the present invention will be drawn from the following detailed description of preferred embodiments of the present invention with the attached drawings, in which:

DETAILED DESCRIPTION OF THE PREFERRED EMBODIMENT

Figure 1:
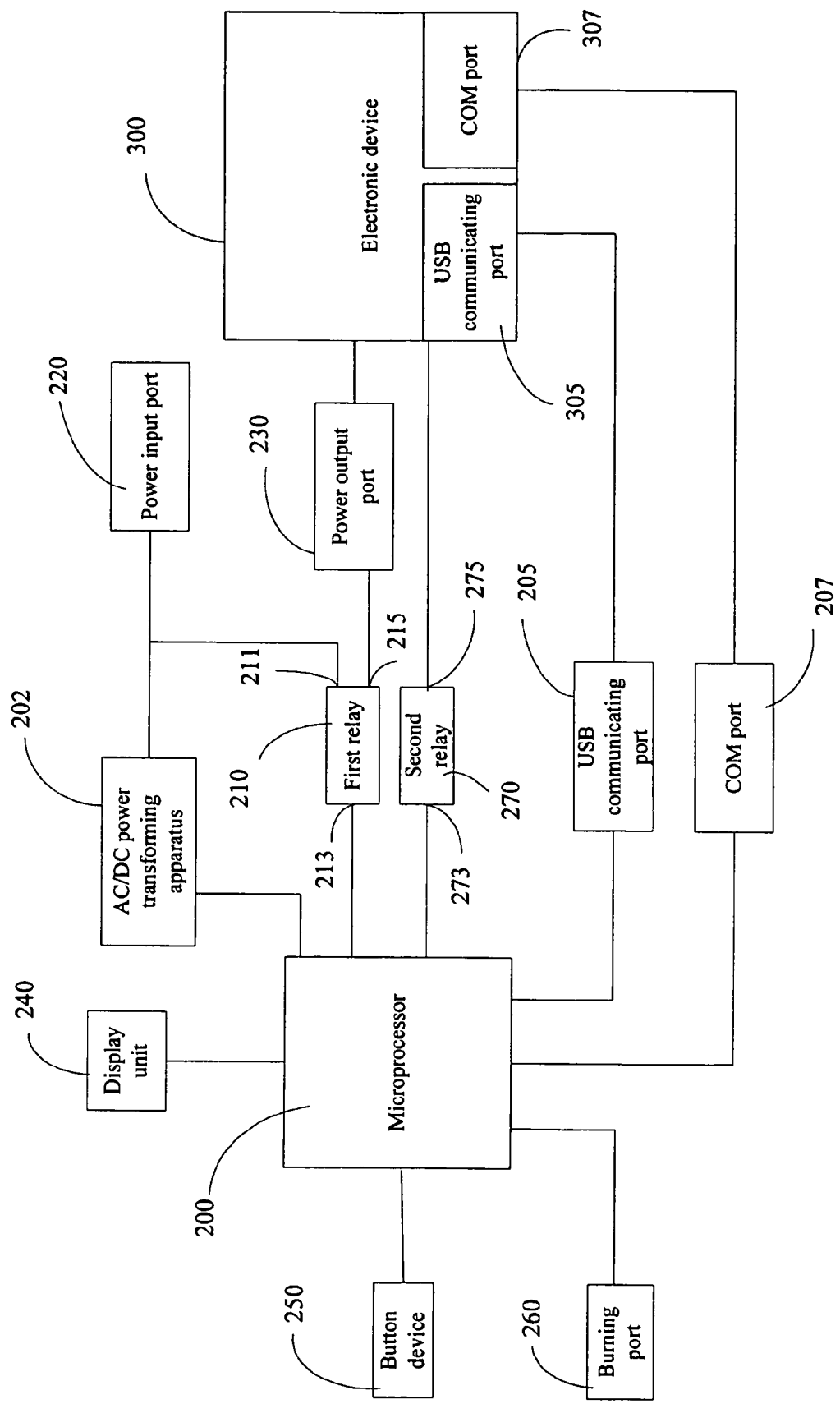
FIG. 1 is a block diagram of a power supply switching controller in accordance with the preferred embodiment of the present invention and an electronic device connected to the power supply switching controller.

Referring to FIG. 1, a controller for controlling on-off switching of a power supply includes a microprocessor 200, an AC/DC (Alternating Current/Direct Current) power transforming apparatus 202, a first relay 210, a second relay 270, a communication unit, a power input port 220, a power output port 230, a display unit 240, a burning port 260, and a button device 250. The communication unit includes a USB (Universal Serial Bus) communication port 205 and a COM port 207. Only one of the communicating ports will be selected when the controller is in use.

An electronic device 300 is connected to the controller waiting for test by the controller. The electronic device 300 includes a USB communication port 305 and a COM port 307 respectively corresponding to the communication ports 205, 207 of the communication unit 305. The electronic device 300 is connected to the power output port 230 and powered on by the power output port 230 when the power output port 230 has power thereon. The electronic device 300 communicates with the microprocessor 200 via one of the communication ports which is selected.

An alternating current power supply (not shown) is connected to the power input port 220 to provide an AC power to the AC/DC power transforming apparatus 202 and the first relay 210 via an input terminal 211 thereof. The AC power is then transformed to a +5V DC power source by the AC/DC power transforming apparatus 202, for providing +5V DC power to the microprocessor 200.

A control terminal 213 of the first relay 210 is connected to the microprocessor 200. An output terminal 215 of the first relay 210 is connected to the power output port 230. The microprocessor 200, via the control terminal 213, controls the first relay 210 to be turned on or off, thus controlling power to or not to the electronic device 300.

A control terminal 273 of the second relay 270 is connected to the microprocessor 200. An output terminal 275 of the second relay 270 is connected to a power button of the electronic device 300. If the electronic device 300 is a personal computer, the electronic device 300 is controlled to start-up when the second relay 270 is switched on. If the electronic device 300 is a server, the second relay 270 is not needed because the server will start-up whenever it is connected to the power source.

The button device 250 is connected to the microprocessor 200 for setting parameters therein. The display unit 240 is connected to the microprocessor 200 for displaying the operating interface or working state of the microprocessor 200. The burning port 260 is connected to the microprocessor 200 for burning a program into it.

Figure 2:
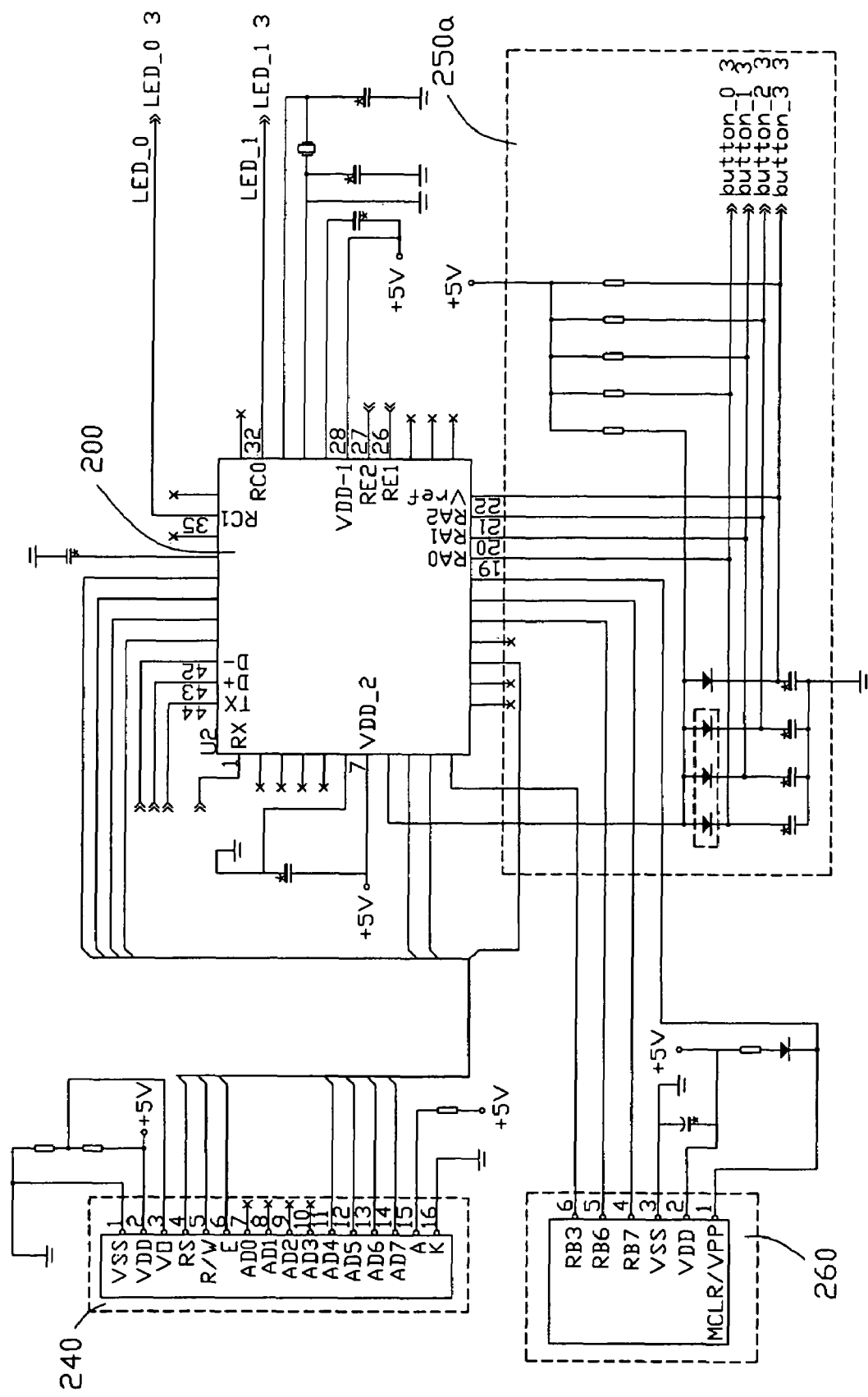
FIG. 2 is a circuit diagram of the microprocessor, display unit, button device, and burning port of the power switching controller of FIG. 1 in accordance with the preferred embodiment of the present invention.
Figure 3:
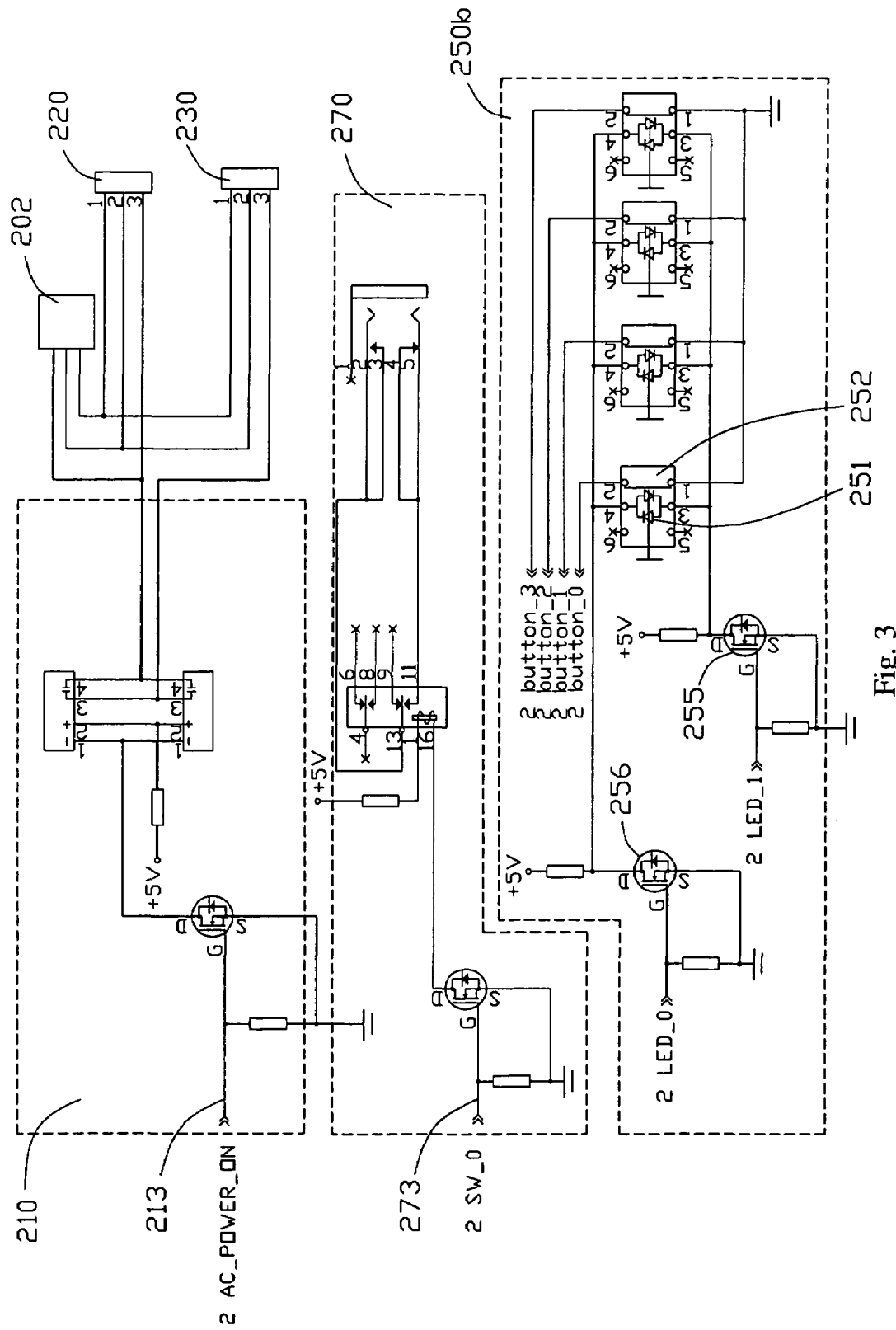
FIG. 3 is a circuit diagram of the AC/DC power transforming apparatus, the first and second relays, the power i/o ports, and the button device of the power switching controller of FIG. 1 in accordance with the preferred embodiment of the present invention.

Referring also to FIGS. 2 and 3, in the detailed circuit diagram of the microprocessor 200, the pins 7 (VDD2) and 28 (VDD1) of the microprocessor 200 are connected to a +5V DC power source of the AC/DC power transforming apparatus 202. The button device 250 includes a part labeled in 250a and a part labeled in 250b. The part labeled in 250a is connected to pins 19 (RA0), 20 (RA1), 21 (RA2), and 22 (Vref) of the microprocessor 200.

The microprocessor 200 has a pin 27 (RE2) connected to the control terminal 213 of the first relay 210 for controlling the first relay 210 to switch on or off. The microprocessor 200 has a pin 26 (RE1) connected to control terminal 273 of the second relay 270 for controlling the second relay 270 to switch on or off. A plurality of green LEDs (light-emitting diodes) 251 and a plurality of red LEDs 252 are disposed in the part labeled in 250b of the button device 250. Pin 32 (RC0) of the microprocessor 200 is connected to a terminal of each LED 251 through a first power amplifier 255. Pin 35 (RC1) of the microprocessor 200 is connected to another terminal of each LED through a second power amplifier 256. When voltage from the first power amplifier 255 is in a high level and that from the second power amplifier 256 is in a low level, the green LEDs 251 is lit to indicate that power is being provided to the electronic device 300. When voltage from the first power amplifier 255 is in a low level and that from the second power amplifier is in a high level, the red LEDs 252 is lit to indicate that power for the electronic device 300 is off.

Figure 4:
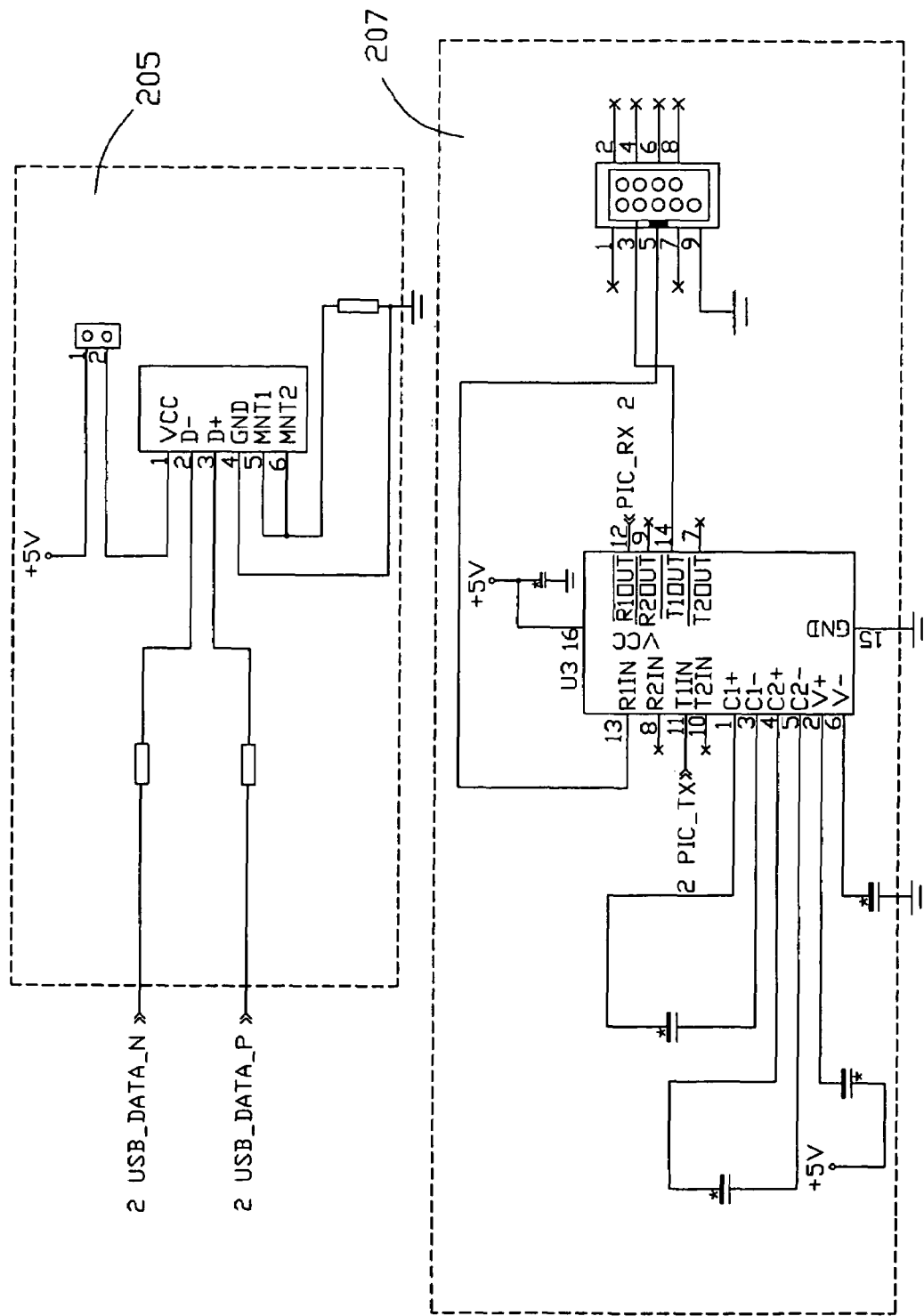
FIG. 4 is a circuit diagram of the USB port and the Serial port of the power switching controller of FIG. 1 in accordance with the preferred embodiment of the present invention.

FIG. 4 shows a circuit diagram of the USB communication port 205 and the COM port 207 which are typical of those generally used in the art. Pins 42 (D−) and 43 (D+) of the microprocessor 200 are connected to the USB communication port 205. Pins 1 (RX) and 44 (TX) of the microprocessor 200 are connected to the COM port 207.

When the power supply switching controller is working, first, the electronic device 300 is connected to the power output port 230. Then, the USB communication port 305 or the COM port 307 of the electronic device 300 is respectively connected to the corresponding USB communication port 205 or the COM port 207 of the microprocessor 200 allowing communication between the microprocessor 200 and the electronic device 300. Both the microprocessor 200 and the electronic device 300 include corresponding power switching controlling programs installed therein. Users run the power switching control program in the electronic device 300 to set a first group running parameter that determines when the electronic device 300 is started up or shut down. Then, the first group running parameter is sent to the microprocessor 200 for controlling the electronic device 300.

Figure 5:
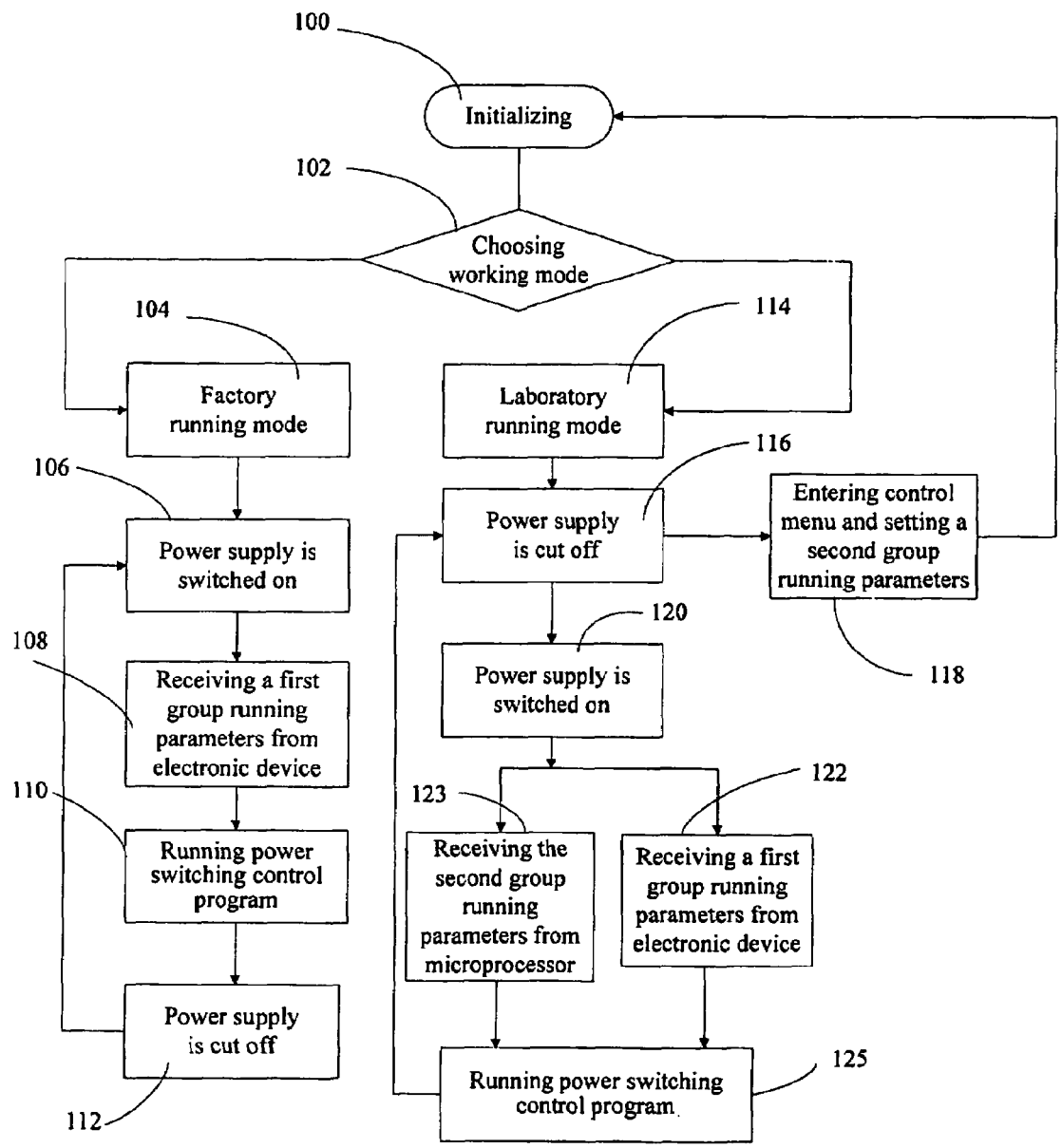
FIG. 5 is a flow chart of the power supply switching control process in accordance with the preferred embodiment of the present invention.

Referring to the FIG. 5, the control process of the power supply switching controller includes a plurality of steps as follows. The power input port 220 of the power supply switching controller is connected to the power supply for initializing the microprocessor 200 (step 100). Users select the working mode of the microprocessor 200 (step 102). The microprocessor 200 may either work in a factory running mode or a laboratory running mode. The factory running mode accommodates testing abundant products in product lines, and the running parameter of the microprocessor 200 is generally set at a fixed value. The laboratory running mode accommodates a product development stage, and the running parameter of the microprocessor 200 can be changed according to different requirements of the designers.

When users select factory running mode (step 104), the first relay 210 and the second relay 270 are switched on (step 106). The electronic device 300 is started up to communicate with the microprocessor 200, and sends the parameters pre-determined in the electronic device 300 to the microprocessor 200 (step 108). The microprocessor 200 runs the power switch control program according to the parameters to control when the electronic device 300 is started up or shut down (step 110). The electronic device 300 is shut down after a pre-determined timing period (step 112). After another pre-determined timing period, the control process returns to step 106 to start up the electronic device 300 again.

When users select laboratory running mode (step 114), the first relay 210 and the second relay 270 are preset to be cut off at the initial state (step 116). Operators select to enter into a control menu or not. When selecting to enter into the control menu, the operators set the running parameters of the power supply switching controller directly to the control menu via the button device 250 (step 118). After setting the parameters, the control process returns to step 100 to initialize again. When selecting not to enter into the control menu, the first relay 210 and the second relay 270 are switched on (step 120), supplying power to the electronic device 300. In the next step, operators can select to accept new parameters from the electronic device 300 (step 122), and the microprocessor 200 runs the power switch control program (step 125) according to the parameters from the electronic device 300. Otherwise, the operators can select to accept the parameters established in the step 118 (step 123), and the microprocessor 200 runs the power switch control program (125).

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A method for controlling at least one electronic device in a test thereof, comprising:
   setting up a controller to control one of said at least one electronic device to be tested in a test thereof;
   providing signal communication between a controller and said at least one electronic device;
   setting running parameters for testing said at least one electronic device; and
   permitting said at least one electronic device to be selectably tested in one of a factory running mode and a laboratory running mode of said controller, said factory running mode testing abundant electronic device products in product lines and said running parameters being set at fixed values, said laboratory running mode testing electronic device products in a development stage and said running parameters being changeable according to different requirements of designers.

2. The method as claimed in claim 1, wherein a microprocessor is installed in said controller so as to conduct control of said electronic device.

3. The method as claimed in claim 1, wherein a selective one of a Universal Serial Bus (USB) communication port and a COM port installed in said controller respectively is used to send signals to and from said controller.

4. A power supply control method for at least one electronic device, comprising:
   initializing a microprocessor of a controller configured for controlling the electronic device;
   selecting a working mode of the microprocessor between a factory running mode and a laboratory running mode, the factory running mode testing abundant electronic device products in product lines and running parameters in the microprocessor being set at fixed values, the laboratory running mode testing electronic device products in a development stage and running parameters in the microprocessor being changeable according to different requirements of designers;

running a power switching program according to different running parameters in the corresponding working mode to control when a power supply of the electronic device is to be switched on or cut off.

5. The control method as claimed in claim 4, wherein when the microprocessor is selected to work in a factory running mode, the power supply of the electronic device is preset to be switched on in an initial state, and the microprocessor receives a first group of running parameters pre-determined in the electronic device with fixed values.

6. The control method as claimed in claim 5, wherein the microprocessor runs a power switch control program according to the first group of running parameters to control when the power supply of the electronic device is switched on or cut off.

7. The control method as claimed in claim 4, wherein when the microprocessor is selected to work in a laboratory mode, the power supply of the electronic device is preset to be cut off in an initial state, and the control method enters a step of selecting whether to enter a control menu for setting a second group of running parameters.

8. The control method as claimed in claim 7, wherein when selecting to enter into the control menu to set the second group of running parameters, the microprocessor is initialized again.

9. The control method as claimed in claim 7, wherein when selecting not to enter into the control menu, the power supply of the electronic device is switched on, the electronic device communicates with the microprocessor and is capable of sending a first group of running parameters thereto.

10. The control method as claimed in claim 9, wherein the control method enters into a step of selecting to receive one of the first and second groups of running parameters.

11. The control method as claimed in claim 10, wherein the microprocessor runs the power switch program according to the first or second group of running parameters to control when the power supply of the electronic device is switched on or cut off.

12. A method for controlling an electronic device in a test thereof, comprising:
    setting up a controller to control an electronic device to be tested in a test thereof;
    providing signal communication between a controller and said electronic device;
    setting a first group of parameters with fixed values for testing said electronic device; and
    allowing to set a second group of changeable parameters during said test when said electronic device is under said test.

13. The method as claimed in claim 12, further comprising a step of selecting a working mode of said controller between a factory running mode and a laboratory running mode, and said second group of running parameters being set when said controller is in said laboratory running mode.

14. The method as claimed in claim 13, wherein a power supply of said electronic device is preset to be cut off in an initial state when said controller is selected to work in said laboratory mode before allowing to set said second group of parameters.

15. The method as claimed in claim 1, wherein when said controller is selected to work in said laboratory mode, a power supply of said at least one electronic device is preset to be cut off in an initial state, and said method enters a step of selecting whether to enter a control menu for setting a second group of running parameters.

* * * * *